United States Patent
Märtens et al.

(10) Patent No.: US 12,542,544 B2
(45) Date of Patent: Feb. 3, 2026

(54) METHOD AND APPARATUS FOR SYNTHESIZING BINARY WAVEFORMS

(71) Applicant: Tallinn University of Technology, Tallinn (EE)

(72) Inventors: Olev Märtens, Tallinn (EE); Anar Abdullayev, Tallinn (EE); Margus Metshein, Tallinn (EE); Marek Rist, Tallinn (EE); Paul Annus, Tallinn (EE); Andrei Krivošei, Tallinn (EE)

(73) Assignee: Tallinn University of Technology, Tallinn (EE)

( * ) Notice: Subject to any disclaimer, the term of this patent is extended or adjusted under 35 U.S.C. 154(b) by 66 days.

(21) Appl. No.: 18/747,671

(22) Filed: Jun. 19, 2024

(65) Prior Publication Data
US 2024/0421805 A1    Dec. 19, 2024

(30) Foreign Application Priority Data
Jun. 19, 2023   (EE) ................. P202300017

(51) Int. Cl.
*H03K 4/02*   (2006.01)

(52) U.S. Cl.
CPC ................... *H03K 4/026* (2013.01)

(58) Field of Classification Search
CPC .................................... H03K 4/026
USPC ........................................ 327/170
See application file for complete search history.

(56) References Cited

U.S. PATENT DOCUMENTS

2023/0318888 A1\*  10/2023  Schultze ............. H04L 27/3881
                                                       375/268

\* cited by examiner

*Primary Examiner* — Tomi Skibinski
(74) *Attorney, Agent, or Firm* — Maine Cernota & Curran

(57) ABSTRACT

A method and device for synthesizing binary waveforms, wherein the initial analogue waveform is first converted into the segments with discrete levels, then each said discrete level section is in turn converted into a binary pulse of the same time duration as the given segment, and the average value of the generated pulse is proportional to the average value of the given initial waveform over the time duration of the given segment.

10 Claims, 3 Drawing Sheets

METHOD AND APPARATUS FOR SYNTHESIZING BINARY WAVEFORMS

RELATED APPLICATIONS

This application claims priority to EE Patent Application P202300017 filed Jun. 19, 2023. This application is herein incorporated by reference in its entirety for all purposes.

TECHNICAL FIELD

The invention belongs to the field of measurement techniques. The invention can be applied for generation of measurement signals, among other things—for synchronous measurements, including the electrical complex impedance measurements. Also, the invention can be used to generate AC voltage in power supply converters.

BACKGROUND OF THE INVENTION

There are known solutions that use delta-sigma modulation to approximate analog waveforms by binary signals (corresponding implementation in digital electronics-see e.g. N. D. Patel and U. K. Madawala, "*Sinewave generation using bit-streams,*" 2008 *34th Annual Conference of IEEE Industrial Electronics*, Orlando, FL, USA, 2008, pp. 1391-1396). The disadvantage of such solution is the frequent alternation of the resulting binary signal levels 1 and 0. In other words, the approximated binary signal consist a very large number of segments, which are often of very short time duration, which complicates the implementation of such a solution and also adds many higher harmonic components to the resulting binary waveform.

There are well-known solutions for generating binary signals to approximate analog waveforms, using pulse-width modulation (PWM), implemented in the analog technique with "natural sweep" (e.g. M. H. Rashid, *Electrónica de Potencia. Circuitos, Dispositivos y Aplicaciones, Third Edition*. Prentice Hall, 2003), where the approximating original signal (such as a sine wave or audio signal) is compared by a comparator with a sawtooth waveform of a higher frequency than the original signal, and the result is a sequence of binary pulses with variable widths-so a PWM signal. The disadvantage of this solution is—that there are relatively many harmonic components in the resulting binary signal, which requires a complex additional analog filter to obtain a pure analog waveform, or when using such a binary signal as a reference signal in synchronous measurements, the mentioned harmonics significantly decrease the quality of synchronous detection.

The closest solution to the proposed invention is the use of the so-called "uniform sampling" PWM to generate binary signals from an analog waveform, where after every fixed time period a pulse with a width corresponding to the approximated value of that time is generated (e.g. J. Richardson and O. T. Kukrer, "*Implementation of a PWM Regular Sampling Strategy for AC Drives,*" *IEEE Trans.*, vol. 645-655). The features and the disadvantages of the mentioned solution are similar to the "naturally generated" solutions described above.

SUMMARY OF THE INVENTION

The goal of the invention is to significantly improve the method and device for the synthesis of binary waveforms with an improved spectrum when approximating analog waveforms.

The stated goal is achieved by a technical solution, where compared to the known solution for generating binary waveforms to approximate the desired waveform—the waveform to be approximated is first converted into segments of discrete levels, then each discrete level segment is further converted into a binary pulse with the same time duration as the given segment, the average value of which is proportional to the average value of the waveform to be approximated over the time duration of the given segment.

It can be reasonable that the values of the mentioned discrete levels are optimized for the best approximation of the desired waveform of the resulting binary waveform according to some criteria.

It can be reasonable that the generation of the mentioned waveform takes place at discrete time values with a uniform time step.

It can also be reasonable that the generation of the mentioned waveform takes place at discrete time values with a non-uniform time step.

It is reasonable that each mentioned binary pulse starts with a positive value, if the mentioned segments of discrete levels have decreasing values in the time; and with a negative value if the mentioned segments with discrete levels have increasing values in time.

It can be reasonable that the initial desired waveform is symmetrical in the time-domain window, and the second half of the binary waveform in the time domain is realized as a mirror image of the first half of the binary waveform.

The waveform to be approximated can be a single frequency sinewave. Alternatively, the waveform to be approximated may contain multiple frequency components (for example, a multi-frequency signal or a time-varying-frequency signal).

It can be reasonable that a correction waveform is added to the waveform to be approximated, which is optimized to get the best approximation of the desired waveform of the resulting binary waveform according to some criteria.

A device for generating binary waveforms may include generator of the discrete-level waveform segments (2), connected in series to an input (ideal waveform) (1), generator of the sequence of the intervals of the binary pulses (3), a buffer of pulse intervals (4) and output means of binary pulses (5), which is connected to the device output (6) (FIG. 3).

BRIEF DESCRIPTION OF THE DRAWINGS

The invention is illustrated by the following figures.

EXAMPLES OF IMPLEMENTATION OF THE INVENTION

Figure 1:
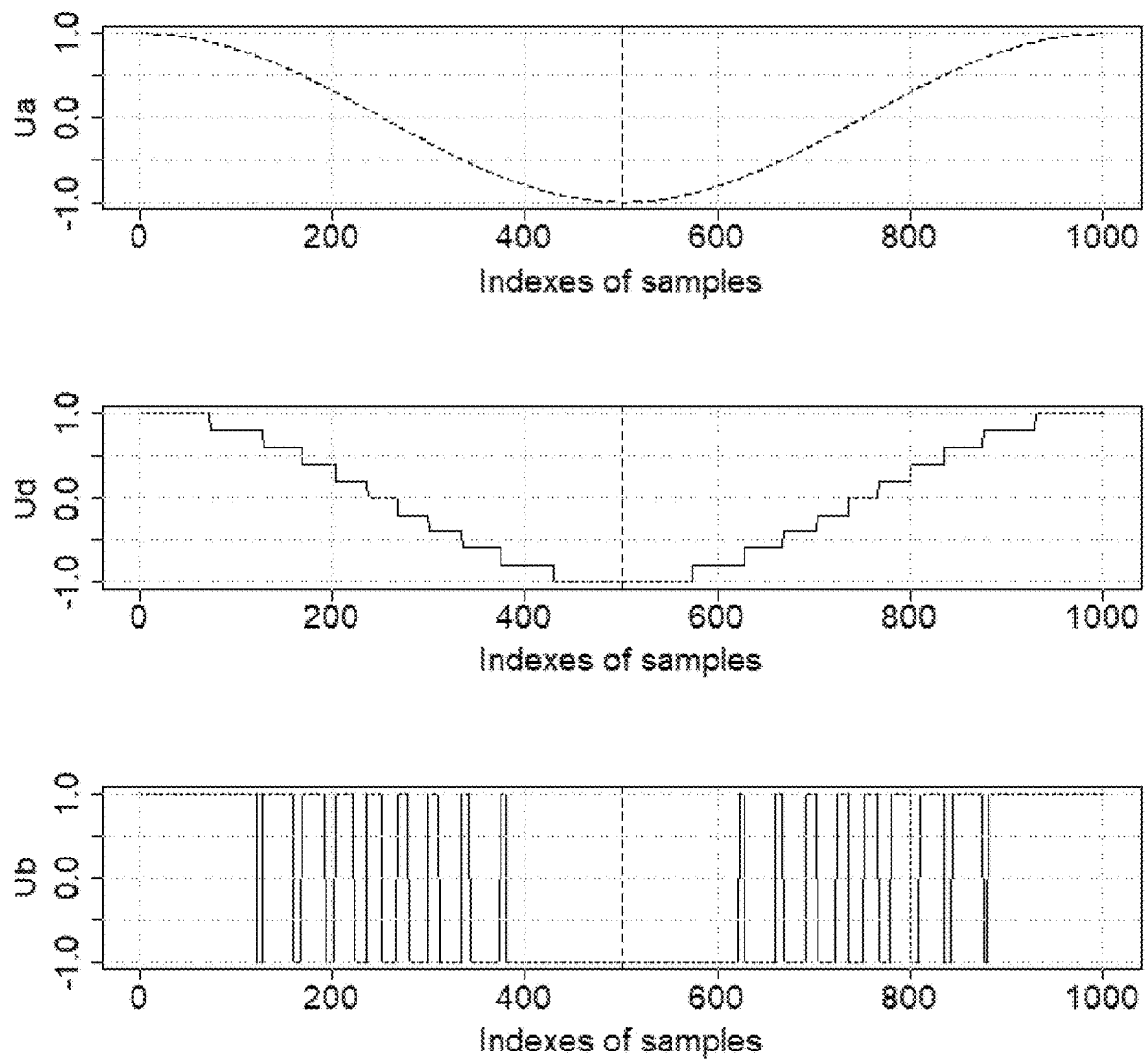
In FIG. 1 (from top to bottom):
the initial ideal (desired) waveform (for example, a sine or cosine waveform, given by one or more periods;
the same converted to discrete level segments; and
the given segments converted into binary pulses of the corresponding width.

The starting point of binary waveform synthesis is the initial ideal (desired) waveform, which is approximated during synthesis—for example, a sine or cosine waveform, given with one or more periods (FIG. 1, upper waveform—as an example, one period of a cosine function). As a second step, the original waveform is converted into discrete-level segments (FIG. 1, middle waveform). In essence, it is a quantization of the original waveform. In the example in addition to the zero level, 5 positive and 5 negative values are used for the discrete levels mentioned, a total of 11 levels. As a third step, each segment with the mentioned discrete level is further converted into a binary pulse with the same time duration as the given segment, the average value of which segment is proportional to the average value of the approximated waveform and the time duration of the given section (FIG. 1, lower waveform).

Figure 2:
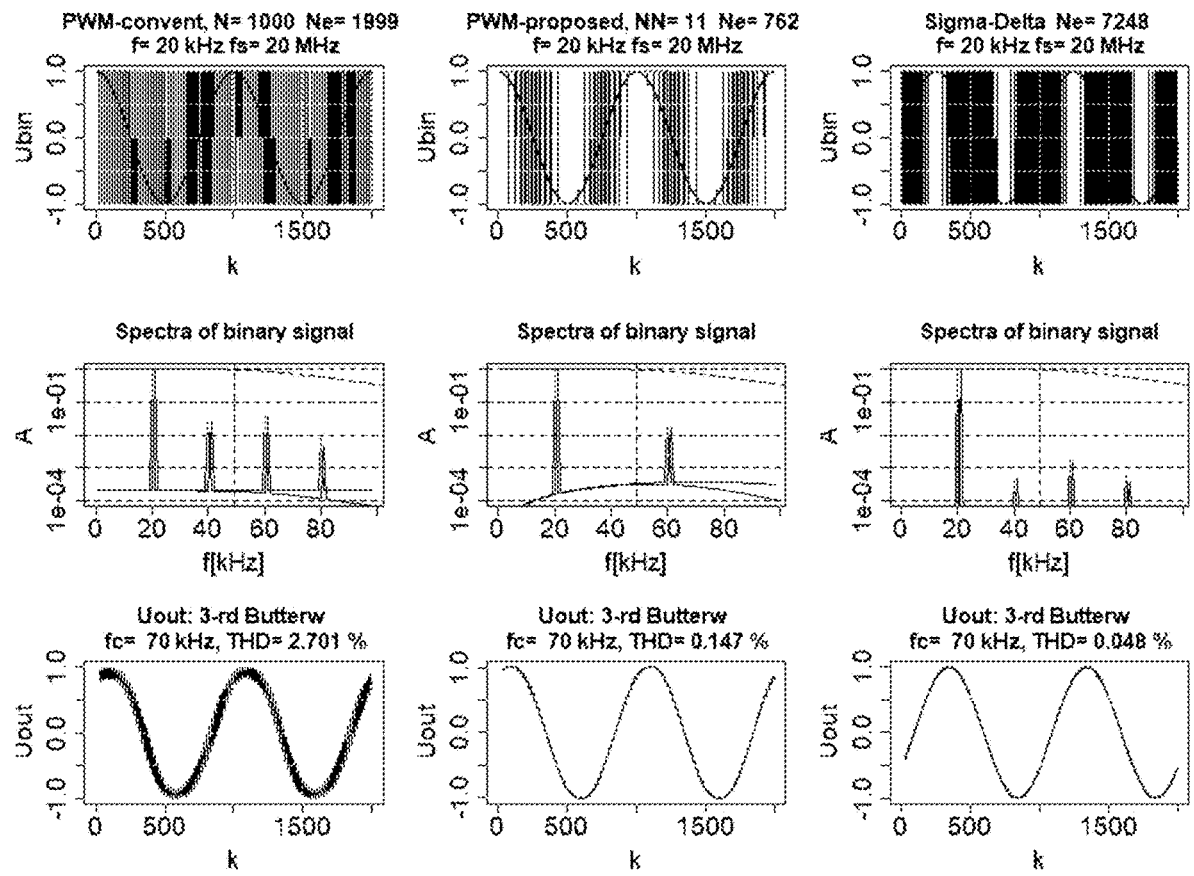
In FIG. 2 shows examples from left to right:
from top to bottom, the conventional uniformly sampled PWM waveform and its spectrum and the analog waveform of the given binary signal after the 3-rd order Butterworth analog filter;
the waveform and its spectrum of the proposed solution and the analog waveform of the given binary signal after the 3-rd order Butterworth analog filter; and
the waveform and its spectrum of the solution with delta-sigma modulation and the analog waveform of the given binary signal after the 3rd order Butterworth analog filter.

FIG. 2 shows examples from left to right of the PWM-waveform with uniform sampling, then the plots of the proposed solution and the solution with delta-sigma modulation in comparison (from top to bottom—the original to be approximated waveform, the resulting binary signal spectrum and the signal shape after the 3-rd order Butterworth analog filter (cutoff frequency fc=70 kHz). It can be seen from the figure that compared to the regular PWM, the proposed solution has a cleaner spectrum and after the mentioned low-pass filter, also a more accurate waveform in the time domain (compared to the original signal). Also the number of needed pulses (and correspondingly the required number of edges of the binary signal) is smaller for proposed solution, compared to delta-sigma modulation solution.

The mentioned discrete levels can be generated by using of a uniform amplitude step. At the same time, it could be beneficial to choose these levels unevenly, optimizing the resulting binary signal by reducing the amplitude of the additional harmonics, either before or after an additional analog low-pass filter. A suitable criteria can be, for example, the minimization of the cumulative linear distortion obtained by the binary approximation of a sine wave, before or after an additional analog low-pass filter.

Binary waveform synthesis can be performed using uniform or alternatively non-uniform sampling in the tome domain.

It is reasonable, that each binary pulse starts with a positive value if the mentioned discrete level sections are of decreasing values in time; and with a negative value if the mentioned segments with discrete levels have increasing values in time.

The original waveform to be approximated may be a single-frequency sine (or cosine) waveform, but may alternatively be a waveform containing multiple frequency components. The latter can be, for example, multi-frequency with the sum of two or more sinuses or a time-varying frequency waveform, e.g. a chirp waveform.

For further (e.g. spectral) improvement of the resulting binary signal, a corrective waveform can be added to the initial approximating waveform, which is optimized to best approximate the desired waveform of the resulting binary waveform according to some criteria. The criteria can be the minimization of the harmonics with the highest amplitude in the generated binary signal, not present in the original waveform. The criteria can also be the minimization of the total sum of harmonics not contained in the original waveform (the total distortion factor of the harmonic components). The mentioned spectral criteria can be used by evaluating the harmonic composition of the resulting binary waveform either before or after an appropriate additional analog low-pass filter. However, the resulting binary signal waveform after an appropriate analog low-pass filter can also be used as an optimization criteria, minimizing the time-domain difference between the original waveform and the resulting waveform, eg by minimizing the root-mean-square error between the approximation and the original waveform.

Figure 3:
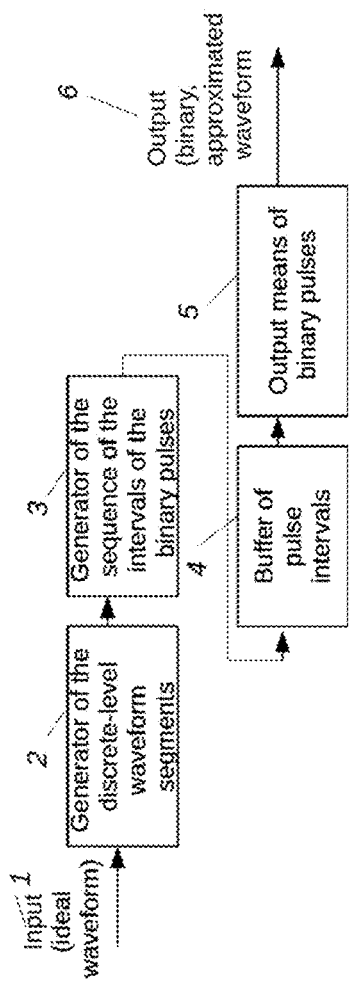
In FIG. 3 a block diagram of the proposed device is shown.

FIG. 3 shows an example of the implementation of the device as a block diagram. Here, the desired (ideal) analog waveform (1) is the input for the generator of the discrete-level waveform segments (2), the output of which is the input to the generator of the sequence of the intervals of the binary pulses (3), which output is the input for the Buffer of pulse intervals (4), which output is connected to output means of binary pulses (5), which is connected to device output (6).

Since such a solution is reasonable to implement in a microcontroller or other digital electronics, it could be reasonable to use the on-chip direct memory access (DMA) unit to generate pulses by using the on-chip PWM hardware units, serving as output means of binary pulses (5), with PWM-values based on the array of values of the buffer of pulse intervals (4), functioning as look-up-table based in the memory buffer of the microcontroller.

The invention claimed is:

1. A method of generating binary waveform(s) to approximate a desired waveform as a sequence of binary pulses, wherein the waveform to be approximated is first converted into segments with discrete levels, then each said segment with discrete levels is further converted into a binary pulse of the same time duration as the given segment so, that the mean value of this pulse is proportional to the mean value of the approximated waveform over the time duration of the given segment.

2. The method of generating waveforms according to claim 1, characterized in that the values of said discrete levels are optimized for the best approximation of the desired waveform of the resulting binary waveform according to some criteria.

3. The method of generating waveforms according to claim 1, wherein the generation of said waveform takes place at discrete time values by a uniform time step.

4. The method of generating waveforms according to claim 1, wherein the generation of said waveform takes place at discrete time values with a non-uniform time step.

5. The method of generating waveforms according to claim 1, wherein each binary pulse starts with a positive value, in the case if said segments with discrete levels are of decreasing values in time, and with a negative value if the mentioned segments with discrete levels have increasing values in time.

6. The method of generating waveforms according to claim 1, wherein the initial desired waveform is a symmetrical in a time window, and the second half of the binary waveform is realized as a mirror waveform of the first half of the binary waveform.

7. The method of generating waveforms according to claim 1, wherein the waveform to be approximated is a single-frequency sinewave.

8. The method of generating waveforms according to claim 1, wherein the waveform to be approximated contains several frequency components.

9. The method of generating waveforms according to claim 1, wherein a corrective waveform is added to the waveform to be approximated, which is optimized as the best approximation of the desired waveform of the resulting binary waveform according to some criteria.

10. A device for generating binary waveforms, the device comprising:
- a generator of the discrete-level waveform segments, connected in series to an input, a generator of the sequence of the intervals of the binary pulses, a buffer of pulse intervals, and output means of binary pulses, which is connected to an output of the device.

\* \* \* \* \*